United States Patent
Tsunoda

Patent Number: 5,514,896
Date of Patent: May 7, 1996

[54] NONVOLATILE SEMICONDUCTOR MEMORY DEVICE

[75] Inventor: Hiroaki Tsunoda, Kawasaki, Japan

[73] Assignee: Kabushiki Kaisha Toshiba, Kawasaki, Japan

[21] Appl. No.: 356,557

[22] Filed: Dec. 15, 1994

[30] Foreign Application Priority Data

Dec. 16, 1993 [JP] Japan .................................. 5-315701

[51] Int. Cl.$^6$ .......................... H01L 29/76; H01L 29/94; H01L 31/062; H01L 31/113
[52] U.S. Cl. ............................................. 257/391; 257/390
[58] Field of Search ...................................... 257/391, 392

[56] References Cited

U.S. PATENT DOCUMENTS

| | | | |
|---|---|---|---|
| 3,969,744 | 7/1976 | Nicholas et al. | 257/392 |
| 5,291,040 | 3/1994 | Oppermann et al. | 257/391 |

OTHER PUBLICATIONS

Muller et al, *Device Electronics for IC's*, pp. 452–453, 1986.

*Primary Examiner*—Jerome Jackson
*Assistant Examiner*—Stephen D. Meier
*Attorney, Agent, or Firm*—Finnegan, Henderson, Farabow, Garrett & Dunner

[57] ABSTRACT

A gate insulating film is provided on the upper surface of an N-type silicon substrate. A floating gate is provided on the gate insulating film, an ONO film is provided on the floating gate, and a control gate is provided on the ONO film. Two diffusion layers for a source and a drain, respectively, are formed by using the control gate as a mask, in self-alignment, in the upper surface of the N-type silicon substrate. A damage layer is formed in a region of the semiconductor substrate, which is located beneath the first gate. The damage layer has an impurity concentration which is the highest at a point located in a depletion layer formed when a data-writing voltage is applied to the memory device and which is located outside a depletion layer formed when a data-reading voltage is applied to the memory device.

12 Claims, 3 Drawing Sheets

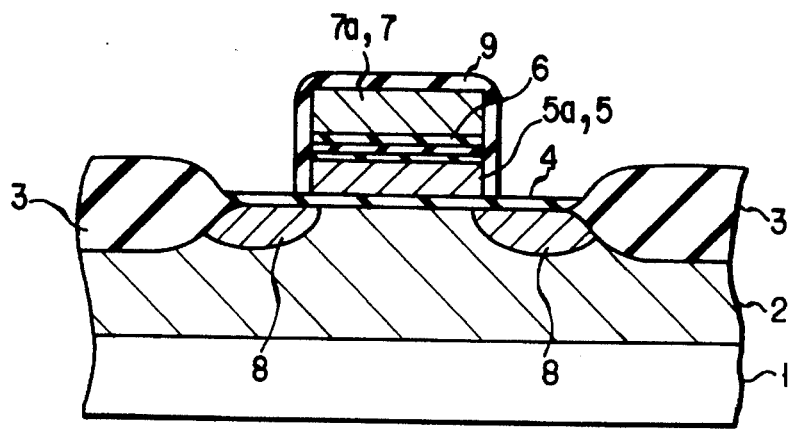
FIG. 1
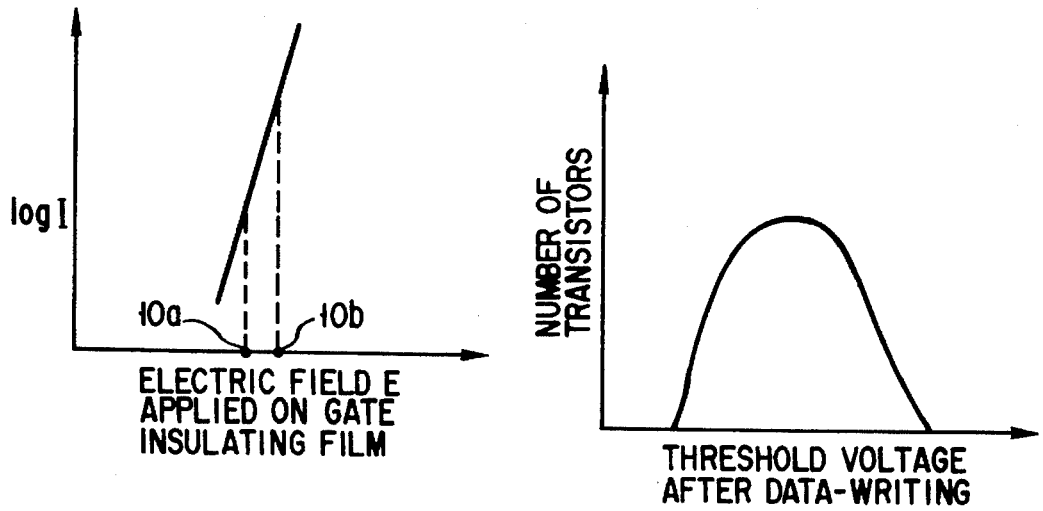
FIG. 2
FIG. 3
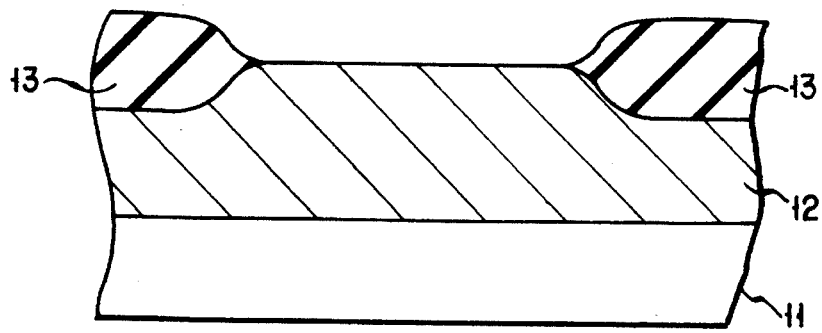
FIG. 4

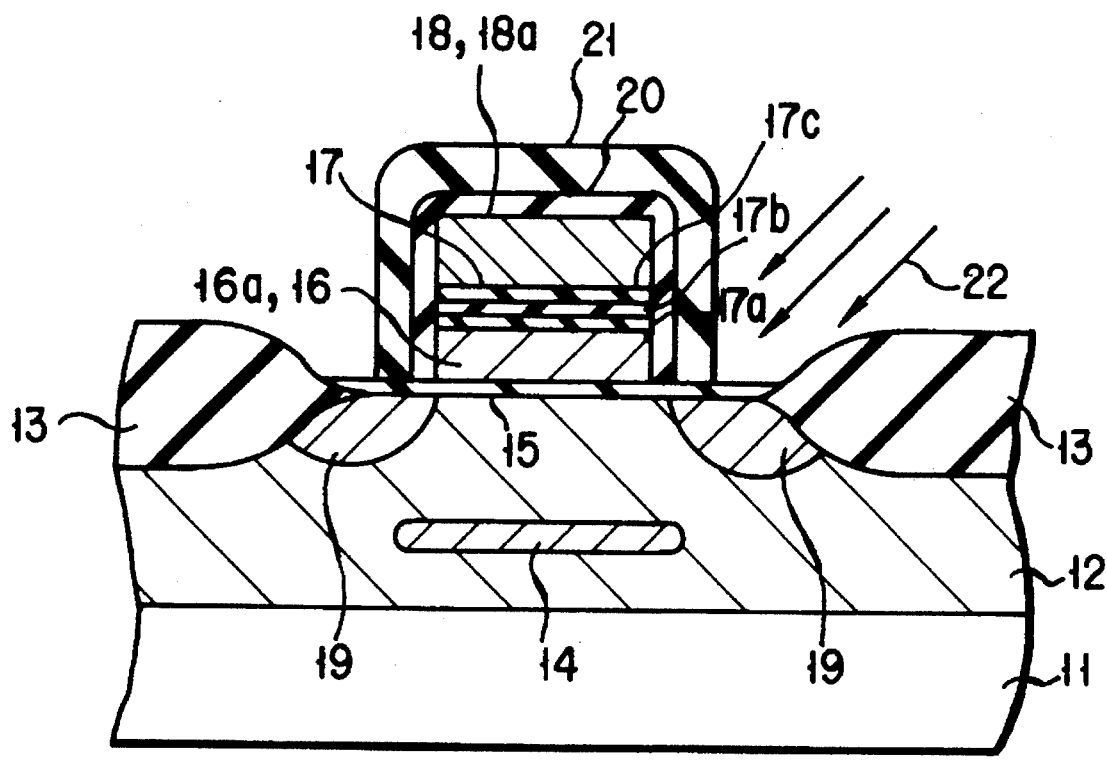
F I G. 9

NONVOLATILE SEMICONDUCTOR MEMORY DEVICE

BACKGROUND OF THE INVENTION

1. Field of the Invention

The present invention relates to a nonvolatile semiconductor memory device into which data is electrically written and from which data is electrically erased, and more particularly to a nonvolatile semiconductor memory device into which data is written by using a tunnel current and to a method of manufacturing the nonvolatile semiconductor memory device.

2. Description of the Related Art

FIG. 1 is a sectional view of a conventional non-volatile semiconductor memory. This memory has been manufactured in the following steps. First, a P-type well layer 2 is formed in the surface of an N-type silicon substrate 1. Then, an element isolating region 3 is formed in the surface of the P-type well layer 2. Thereafter, a gate insulating film 4 is formed on the P-type well layer 2. A first polysilicon layer 5a is deposited on the gate insulating film 4. Phosphorus is diffused into the polysilicon layer 5a, thereby adding phosphorus to the layer 5a. Next, an ONO film 6 is deposited on the first polysilicon layer 5a. The ONO film 6 has a three-layer structure, comprised of the lower layer made of oxide, the intermediate layer made of nitride and the upper layer made of oxide. Further, a second polysilicon layer 7a is deposited on the ONO film 6. Phosphorus is diffused into the second polysilicon layer 7a, thereby adding phosphorus to the layer 7a.

Next, the polysilicon layers 5a and 7a and the ONO film 6 are subjected to photolithography. A floating gate 5 is thereby formed on the gate insulating film 4, and an a control gate 7 is formed on the ONO film 6 and located above the floating gate 5. Thereafter, ions are implanted into the P-type well layer 2, using the control gate 7 and the element isolating region 4 as 10 masks. Two N-type diffusion layers 8, which serve as a source region and a drain region, respectively, are thereby formed in the P-type well layer 2. Then, an insulating film 9 is formed on the sides of the floating gate 5 and on the sides and upper surface of the control gate 7.

How data is written into the conventional nonvolatile semiconductor memory will be explained below.

The P-type well layer 2 and the N-type diffusion layers 8 (i.e., the source and drain regions) are connected to the ground, and a programming voltage $v_{ppw}$, which is of a positive value, is applied to the control gate 7. As a result, capacitance $C_{FC}$ is built up in a capacitor constituted by the floating gate 5 and the control gate 7, and capacitance $C_{FW}$ is built up in a capacitor constituted by the floating gate 5 and the P-type well layer 2. By virtue of the capacitances $C_{FC}$ and $C_{FW}$, the programming voltage $v_{ppw}$ is divided into a voltage $V_{FC}$ and a voltage $V_{FW}$, which are represented by Equations (1) and (2) given below. The voltage $V_{FC}$ is applied between the floating gate 5 and the control gate 7. The voltage $V_{FW}$ is applied between the floating gate 5 and the P-type well layer 2. The voltage $V_{FW}$ is applied on the gate insulating film 4, whereby an N-type inversion layer is formed in that surface region of the P-type well layer 2 which lies below the floating gate 5. The source region and the drain region are thereby set at the same potential. Since the N-type diffusion layers 8 (i.e., the source and drain regions) are grounded, the N-type inversion layer is set at the ground potential. Hence, a positive voltage is virtually applied to the floating gate 5 provided on the insulating film 4 which in turn is provided on the N-type silicon substrate 1.

Therefore, a current having density J which is represented by Equation (3) flows to the floating gate 5. Electrons are thereby injected into the floating gate 5, and data is written into the transistor. Once the data has been written into the transistor, the threshold voltage of the transistor must remain within a prescribed allowable range.

$$VFC = CFW \cdot v_{ppw}/(C_{FC}+C_{FW}) \qquad (1)$$

$$VFW = CFC \cdot v_{ppw}/(C_{FC}+C_{FW}) \qquad (2)$$

$$J = \alpha(v_{FW}/T_{OX})^2 \cdot \exp(-\beta \cdot T_{OX}/V_{FW}) \qquad (3)$$

In Equation (3), $T_{OX}$ is the thickness of the gate insulating film 4 and $\alpha$ and $\beta$ are proportionality constants.

When the current having density J represented by Equation (3) flows to the floating gate 5, a small change in $V_{FW}/T_{OX}$ causes a large change in the current density J as can be understood from Equation (3). The change of $V_{FW}/T_{OX}$, though small, results from changes in the manufacturing conditions of the conventional nonvolatile semiconductor memory. The intensity of the electric field applied on the gate insulating film 4 changes, and the density J of the current flowing to the floating gate 5 varies inevitably. The threshold voltage of the transistor changes unavoidably. The greater the number of electrons injected into the floating gate 5, the larger the change of the threshold voltage. Consequently, in the conventional memory it is difficult to hold the threshold voltage of the transistor within the prescribed allowable range.

In other words, as is evident from FIG. 2, the current I supplied to the floating gate changes greatly even if the difference between the maximum intensity 10b and minimum intensity 10a of the electric field E ($=V_{FW}/T_{OX}$) is small. Many of the transistors incorporated in the conventional memory have their threshold voltage much changed as shown in FIG. 3 after data has been written into them. For this reason, the conventional nonvolatile semiconductor memory can be manufactured but at a low yield.

SUMMARY OF THE INVENTION

A first object of the present invention is to provide a nonvolatile semiconductor memory device comprising transistors whose threshold voltages remain within a prescribed allowable range after data has been written into them.

The first object is attained by a nonvolatile semiconductor memory device according to the invention, which comprises:

a semiconductor substrate;

a gate insulating film provided on an upper surface of the semiconductor substrate;

a first gate provided on the gate insulating film;

an insulating film provided on the first gate;

a second gate provided on the insulating film;

source and drain regions provided in the semiconductor substrate, formed in the upper surface of the semiconductor substrate, in self-alignment, by using the second gate as a mask; and a damage layer provided in a region of said semiconductor substrate, which is located beneath said first gate, and having a peak impurity concentration at a point located deeper in said semiconductor substrate than a depletion layer formed when a data-reading voltage is applied to the memory device and located less deep than a depletion layer formed when a data-writing voltage is applied to the memory device.

A second object of the present invention is to provide a method of manufacturing a nonvolatile semiconductor memory device comprising transistors whose threshold voltages remain within a prescribed allowable range after data has been written into them.

The second object is achieved by a method of manufacturing a nonvolatile semiconductor memory device according to the invention, which comprises the steps of:

forming a damage layer in a region of a semiconductor substrate region by implanting argon ions into the semiconductor substrate, the damage layer having an argon concentration which is the highest at a point located in a depletion layer formed when a data-writing voltage is applied to the memory device and which is located outside a depletion layer formed when a data-reading voltage is applied to the memory device;

forming a gate insulating film on an upper surface of the semiconductor substrate;

forming a first gate on the gate insulating film;

forming an insulating film on the first gate;

forming a second gate on the insulating film; and forming source and drain regions in the upper surface of the semiconductor substrate, in self-alignment, by using the second gate as a mask.

In the present invention, a damage layer is formed in a region of the semiconductor substrate by implanting argon ions into the semiconductor substrate. The damage layer has an argon concentration which is the highest at a point located in a depletion layer formed when a data-writing voltage is applied to the memory device and which is located outside a depletion layer formed when a data-reading voltage is applied to the memory device. Since the damage layer is located within the depletion layer formed when a data-writing voltage is applied, the current flowing into the floating gate remains within a prescribed range even if the electric field applied on the gate insulating film is intensified due to changes in the manufacturing conditions of the memory device. The threshold voltage of each transistor incorporated in the memory device can remain within a prescribed allowable range after data has been written into the device. Moreover, since the damage layer is located outside a depletion layer formed when a data-reading voltage is applied, the it does not adversely influence the data-reading operation of the nonvolatile semiconductor memory device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of a conventional nonvolatile semiconductor memory;

FIG. 2 is a graph representing the relation which the electric field E applied to the gate insulating film and the current I supplied to the floating gate have when data is written into the conventional memory;

FIG. 3 is a graph illustrating the distribution of the threshold voltages of the transistors incorporated in the conventional memory;

FIGS. 4, 5 and 6 are sectional views explaining three consecutive steps of a method of manufacturing a nonvolatile semiconductor memory according to the first embodiment of the invention;

FIG. 9 is a sectional view explaining a method of manufacturing a nonvolatile semiconductor memory according to the second embodiment of the invention.

DETAILED DESCRIPTION OF THE PREFERRED EMBODIMENTS

Embodiments of the present invention will now be described with reference to the accompanying drawings.

A method of manufacturing a nonvolatile semiconductor memory according to the first embodiment of the invention will be explained below, with reference to FIGS. 4, 5 and 6 which are sectional views explaining three consecutive steps of the method.

First, a silicon oxide film (not shown) about 100 nm thick is formed on the upper surface of an N-type silicon substrate 11 by performing hydrogen-combustion oxidation at 950° C. Boron (B) ions are then implanted into the N-type silicon substrate 11 in a dose of $1\times10^{13}$ cm$^{-2}$ at an acceleration voltage 150 keV. The N-type silicon substrate 11 is heated at 1200° C. for 20 hours in an $N_2$ atmosphere, thereby forming a P-type well layer 12 in the upper surface of the substrate 11 as is illustrated in FIG. 4.

Next, the silicon oxide film is removed from the substrate 11 by using buffered HF solution. LOCOS (Local Oxidation of Silicon) method is carried out, forming element isolating regions 13 on the as shown in FIG. 4.

Figure 5:
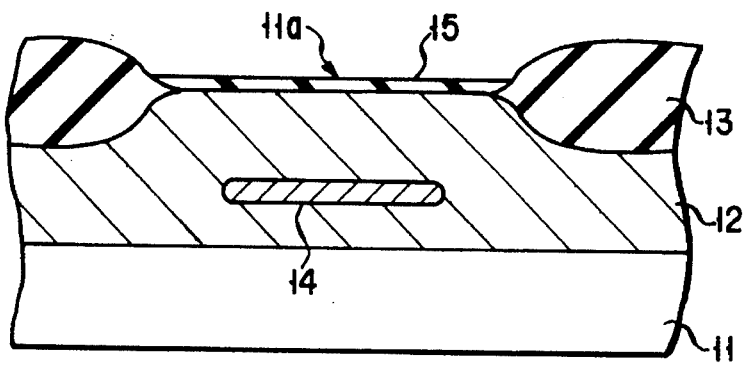
Figure 6:
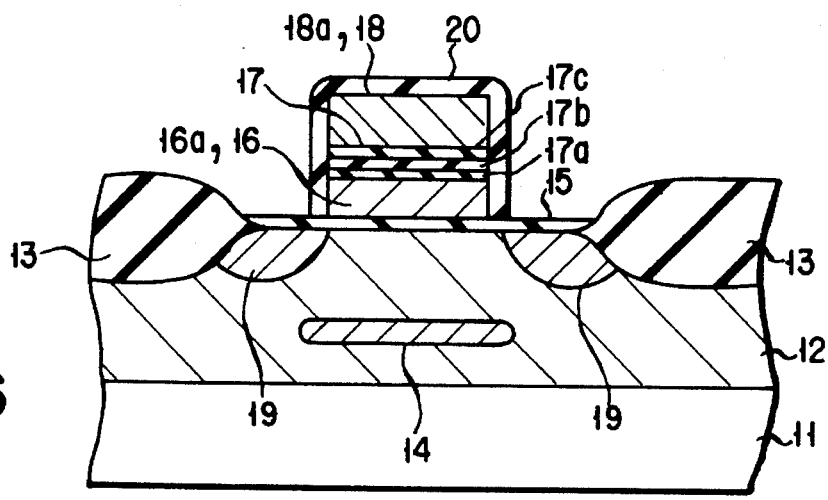

Further, as shown in FIG. 5, an element region 11a is formed on the exposed portion of the N-type silicon substrate 11, which lies between the element isolating regions 13. Argon (Ar) ions are then implanted into the P-type well layer 12, using the element isolating regions 13 as a mask. A damage layer 14 is thereby formed in the P-type well layer 12. In the course of the implantation of argon ions, any part of the well layer 13, other than that part in which the damage layer 14 is to be formed, may be covered with a photoresist.

More specifically, argon ions are implanted into the well layer 12 at a dose of $5\times10^{15}$ cm$^{-2}$ or more and at such as an acceleration voltage that the argon concentration has a peak at a point located deeper than a depletion layer which is formed when a data-reading voltage is applied to the memory, and less deep than a depletion layer which is formed when a data-writing voltage is applied to the memory. In other words, the damage layer 14 is provided in the P-type well layer 12 and has the highest argon concentration at a point in a depletion layer formed when the data-writing voltage is applied to the memory and outside a depletion layer formed when the data-reading voltage is applied to the memory.

Then, a gate insulating film 15 having a thickness of about 10 nm is formed on the element region 11a at 800° C. in a mixture atmosphere of HCl and $O_2$.

Next, a first polysilicon layer 16a about 200 nm thick is deposited on the element isolating region 13 and the gate insulating film 15 by means of LPCVD (Low-Pressure Chemical Vapor Deposition) method. The unfinished product is then heated at 850° C. for 30 minutes in a $POCl_3$ atmosphere. Phosphorus is thereby added to the first polysilicon layer 16a.

Thereafter, an ONO film 17, which is a three-layer film, is formed on the polysilicon layer 16a. To be more precise, the incomplete product is heated at 1000° C. in a mixture atmosphere of $N_2$, HCl and $O_2$, whereby an oxide film 17a about 15 nm thick is formed on the polysilicon layer 16a. Then, a silicon nitride film 17b about 15 nm thick is deposited on the oxide film 17a by means of LPCVD method. Next, a first oxide 17c about 4 nm thick is formed on the silicon nitride film 17b, by performing hydrogen-combustion oxidation at 950° C. for 50 minutes.

Further, a second polysilicon layer 18a having thickness of about 400 nm is deposited on the ONO film 17 by means of LPCVD method. The unfinished product is heated at 900° C. in a $POCl_3$ atmosphere, whereby phosphorus is added to the second polysilicon layer 18a. Then, the first polysilicon layer 16a, the second polysilicon layer 18a and the ONO film 17 are subjected to photolithography. As a result of this, a floating gate 16 is thereby formed on the gate insulating film 15, and a control gate 18 is formed on the ONO film 17 mounted on the floating gate 16.

Thereafter, the floating gate 16 and the control gate 18 are heated at 900° C. for 10 minutes in an $O_2$ atmosphere and thereby oxidized. Further, arsenic (As) ions are implanted into the P-type well layer 12 at a dose of $1\times10^{14}$ cm$^{-2}$ at an acceleration voltage of 50 keV, by using the control gate 18 and the element isolating region 13 as a mask. Diffusion layers 19 serving as a source and a drain are thereby formed in the well layer 12, in self-alignment with the upper surface of well layer 12. The floating gate 16 and the control gate 18 are then heated and oxidized at 950° C. for 30 minutes in an $O_2$ atmosphere. A second oxide film 20 is thereby formed on the upper surface and sides of the control gate 18, on the sides of the floating gate 16, and on the sides of the ONO film 17.

Figure 7:
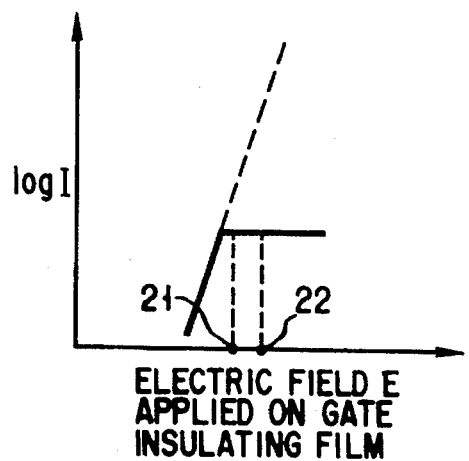
FIG. 7 is a graph illustrating the relation which the electric field E applied to the gate insulating film and the current I supplied to the floating gate have when data is written into the memory according to the first embodiment of the invention.
Figure 8:
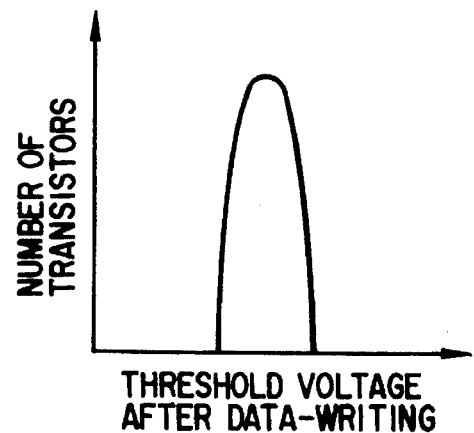
FIG. 8 is a graph illustrating the distribution of the threshold voltages of the transistors incorporated in the first embodiment of the invention.

In the first embodiment, the element isolating region 13 is formed on the P-type well layer 12, and argon ions are implanted into the layer 12 by using the region 13 as a mask, thereby forming the damage layer 14 in the well layer 12. The damage layer 14 is so located in the layer 12 as to have the highest argon concentration at a point in a depletion layer formed when the data-writing voltage is applied to the memory and outside a depletion layer formed when the data-reading voltage is applied to the memory. Namely, the damage layer 14 is located less deep than a depletion layer formed when the data-writing voltage is applied. Hence, the current I supplied to the floating gate 16 remains at a predetermined value as shown in FIG. 7, even if the electric field E applied to the gate insulating film 15 to write data into the memory changes between a minimum value 21 and a maximum value 22. As is evident from FIG. 8, the transistor shown in FIG. 6 has a threshold voltage well within a prescribed allowable range after data has been written into it.

Since the damage layer 14 is located deeper than a depletion layer formed when the data-reading voltage is applied, it will not adversely influence the data being read from the transistor. In other words, the damage layer 14 does not affect data-reading operation at all.

As indicated above, ions of argon (Ar) are implanted into the implanted into the P-type well layer 12, forming the damage layer 14. Instead, ions of another element, such as oxygen (O), carbon (C) or nitrogen (N), may be implanted into the layer 12 at an acceleration voltage optimal for the project range of the atoms of the element, in order to form a damage layer in the P-type well layer 12.

The dose at which argon ions are implanted is not limited to the above-described dose of $5\times10^{15}$ cm$^{-2}$ or more. Rather, argon ions can be implanted in any other dose, provided that damage to the P-type well layer 12 is not eliminated in any subsequent heating step.

As described above, the argon ions are implanted into the layer 12 after the element isolating region 13 has been formed on the P-type well layer 12. Alternatively, the argon ions may be implanted into the layer 12 after the first polysilicon layer 16a has been deposited on the region 13 and the gate insulating film 15. Still alternatively, the argon ions may be implanted into the layer 12 after the second polysilicon layer 18a has been deposited on the ONO film 17. To form a damage layer successfully in either alternative case, it is necessary to adjust both the dose of the argon ions and the acceleration voltage.

FIG. 9 explains a method of manufacturing a non-volatile semiconductor memory according to the second embodiment of the invention. The components shown in FIG. 9, which are similar or identical to those shown in FIG. 6, are designated at the same reference numerals and will not be described in detail.

As shown in FIG. 9, an element region 11a is formed on the exposed portion of the N-type silicon substrate 11. Then, a gate insulating film 15 about 10 nm thick is formed on the element region 11a at 800° C. in a mixture atmosphere of HCl and $O_2$. A second oxide film 20 is formed on the upper surface and sides of a control gate 18, on the sides of a floating gate 16, and on the sides of an ONO film 17. Next, a resist 21 is formed on the second oxide film 20. Further, argon ions 22 are implanted into a P-type well layer 12, applied at a particular angle to the upper surface of the layer 12 to form a damage layer 14. The acceleration voltage, the dose of argon ions, and the ion-implanting angle need to be adjusted so that the resultant damage layer 14 is located beneath the floating gate 16.

The non-volatile semiconductor memory according to the second embodiment can have the same advantages as the memory according to the first embodiment.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising:

a semiconductor substrate;

a gate insulating film provided on an upper surface of said semiconductor substrate;

a first gate provided on said gate insulating film;

an insulating film provided on said first gate;

a second gate provided on said insulating film;

source and drain regions provided in said semiconductor substrate, formed in self-alignment, by using said second gate as a mask; and a damage layer provided in a region of said semiconductor substrate, which is located beneath said first gate, and having a peak impurity concentration at a point located deeper in said semiconductor substrate than a depletion layer formed when a data-reading voltage is applied to the memory device and located less deep than a depletion layer formed when a data-writing voltage is applied to the memory device.

2. A memory device according to claim 1, wherein said first gate is a floating gate.

3. A memory device according to claim 1, wherein said second gate is a control gate.

4. A memory device according to claim 1, wherein said insulating film is an ONO film.

5. A nonvolatile semiconductor memory device comprising:

a semiconductor substrate;

a gate insulating film provided on an upper surface of said semiconductor substrate;

a first gate provided on said gate insulating film;

an insulating film provided on said first gate;

a second gate provided on said insulating film;

source and drain regions provided in said semiconductor substrate, formed in self-alignment, by using said second gate as a mask; and a damage layer provided in a region of said semiconductor substrate, which is located beneath said first gate, and having a peak impurity concentration at a point located deeper in said semiconductor substrate than a depletion layer formed when a data-reading voltage is applied to the memory device and located less deep than a depletion layer formed when a data-writing voltage is applied to the memory device, wherein said damage layer controls the amount of charges injected into the first gate from said semiconductor substrate.

6. A memory device according to claim 5, wherein said first gate is a floating gate.

7. A memory device according to claim 5, wherein said second gate is a control gate.

8. A memory device according to claim 5, wherein said insulating film is an ONO film.

9. A nonvolatile semiconductor memory device comprising:

a semiconductor substrate;

a gate insulating film provided on an upper surface of said semiconductor substrate;

a first gate provided on said gate insulating film;

an insulating film provided on said first gate;

a second gate provided on said insulating film;

source and drain regions provided in said semiconductor substrate, formed in self-alignment, by using said second gate as a mask; and a damage layer provided in a region of said semiconductor substrate which is located beneath said first gate, wherein said damage layer controls the amount of current supplied to the first gate from said semiconductor substrate when a data-writing voltage is applied to the memory device.

10. A memory device according to claim 9, wherein said first gate is a floating gate.

11. A memory device according to claim 9, wherein said second gate is a control gate.

12. A memory device according to claim 9, wherein said insulating film is an ONO film.

* * * * *